(12) United States Patent
Gwoziecki et al.

(10) Patent No.: US 11,251,274 B2
(45) Date of Patent: Feb. 15, 2022

(54) FIELD PLATE SEMICONDUCTOR DEVICE

(71) Applicant: COMMISSARIAT À L'ÉNERGIE ATOMIQUE ET AUX ÉNERGIES ALTERNATIVES, Paris (FR)

(72) Inventors: Romain Gwoziecki, Grenoble (FR); Gwenaël Le Rhun, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 91 days.

(21) Appl. No.: 16/680,997

(22) Filed: Nov. 12, 2019

(65) Prior Publication Data
US 2020/0152747 A1 May 14, 2020

(30) Foreign Application Priority Data

Nov. 13, 2018 (FR) ...................................... 1860466

(51) Int. Cl.
*H01L 29/40* (2006.01)
*H01L 29/78* (2006.01)
*H01L 29/51* (2006.01)
*H01L 29/778* (2006.01)

(52) U.S. Cl.
CPC .......... *H01L 29/402* (2013.01); *H01L 29/516* (2013.01); *H01L 29/7786* (2013.01); *H01L 29/78391* (2014.09)

(58) Field of Classification Search
CPC ............. H01L 29/78391; H01L 29/516; H01L 29/7786; H01L 29/408; H01L 29/517; H01L 29/861; H01L 29/205; H01L 29/2003; H01L 29/402–407; H01L 29/778–7789; H01L 29/15–158
See application file for complete search history.

(56) References Cited

U.S. PATENT DOCUMENTS

| | | | |
|---|---|---|---|
| 2005/0274977 A1* | 12/2005 | Saito ................. | H01L 29/41725 257/192 |
| 2006/0024524 A1* | 2/2006 | Tachikawa .......... | H01L 51/0018 428/690 |
| 2006/0038242 A1 | 2/2006 | Hsu et al. | |
| 2006/0157729 A1 | 7/2006 | Ueno et al. | |
| 2008/0272397 A1 | 11/2008 | Koudymov et al. | |
| 2008/0283870 A1 | 11/2008 | Sato | |
| 2014/0048796 A1 | 2/2014 | Baek et al. | |
| 2014/0239256 A1* | 8/2014 | Kim .................... | H01L 21/0262 257/29 |
| 2014/0264360 A1* | 9/2014 | Huang .............. | H01L 29/66462 257/76 |

(Continued)

OTHER PUBLICATIONS

Search Report as issued in French Patent Application No. 1860466, dated Jul. 2, 2019.

*Primary Examiner* — Shahed Ahmed
(74) *Attorney, Agent, or Firm* — Pillsbury Winthrop Shaw Pitman LLP

(57) ABSTRACT

A semiconductor device includes a substrate; a semiconductor structure arranged on the substrate, the semiconductor structure including at least one first semiconductor layer; an insulator layer arranged on the semiconductor structure; a field plate covering a part of the insulator layer, wherein the insulator layer includes a non-linear dielectric material having a permittivity that decreases as an electric field traversing the dielectric material increases.

5 Claims, 2 Drawing Sheets

(56) References Cited

U.S. PATENT DOCUMENTS

2016/0013279 A1* 1/2016 Ng ............... H01L 29/7393
  257/488
2018/0040726 A1* 2/2018 Nakayama ........... H01L 29/408
2019/0081164 A1* 3/2019 Shrivastava ......... H01L 29/402

* cited by examiner

FIELD PLATE SEMICONDUCTOR DEVICE

CROSS-REFERENCE TO RELATED APPLICATIONS

This application claims priority to French Patent Application No. 1860466, filed Nov. 13, 2018, the entire content of which is incorporated herein by reference in its entirety.

FIELD

The present invention relates to a field plate semiconductor device.

BACKGROUND

FIG. 1 shows an example of a field plate semiconductor device 100 of the prior art. In this case it is a lateral power diode 100. The diode 100 comprises a heterostructure formed by superimposition of a first semiconductor layer 101 made of gallium nitride (GaN) and a second semiconductor layer 102 made of aluminium gallium nitride (Al-GaN). The diode 100 comprises an active zone 103 in the form of a gas of electrons present at the interface between the two semiconductor layers 101, 102.

The diode 100 also comprises an anode 105 and a cathode 106 arranged on the first semiconductor layer 101. An insulator layer 107 extending between the anode 105 and the cathode 106 is arranged on the second semiconductor layer 102. The insulator layer 107 comprises a dielectric material such as silicon oxide ($SiO_2$) or silicon nitride (SiN). The field plate is formed by a metal electrode 108 arranged on the insulator layer 107. The field plate makes it possible to have better distribution of the electric field in order to avoid electric field peaks which could damage the semiconductor device 100.

Another effect of the field plate is that of the depletion of the gas of electrons when the diode 100 is polarised in locked mode. This depletion makes it possible to reduce the leakage current of the reverse polarised diode 100. The polarisation voltage for which the gas of electrons is completely depleted depends on the capacitance of the insulator layer 107, thus on its thickness and on the permittivity of the dielectric material that composes it. Consequently, in order to lock the diode 100 more rapidly, it is possible to increase the capacitance of the insulator layer 107, for example by reducing its thickness and/or by using a material having higher permittivity.

A drawback in choosing a dielectric material having higher permittivity is that it increases the electric field in the diode 100, notably in the semiconductor layers situated under the insulator layer 107. For high voltage values in locked polarisation mode, the diode 100 may thus undergo degradations, for example breakdown of the semiconductor layers.

In addition, a drawback of reducing the thickness of the insulator layer is that the layer becomes more difficult to form and that it has a lower breakdown voltage and thus an increased risk of being damaged.

SUMMARY

An aspect of the present invention aims to resolve the problems that have been mentioned. To this end, an aspect of the present invention proposes a semiconductor device comprising:
a substrate;
a semiconductor structure arranged on the substrate, the semiconductor structure including at least one first semiconductor layer;
an insulator layer arranged on the semiconductor structure;
a field plate covering a part of the insulator layer;
the insulator layer comprising a non-linear dielectric material having a permittivity that decreases as an electric field traversing the dielectric material increases.

Thus, the permittivity of the non-linear dielectric material is higher when the electric field is low, which makes it possible to deplete the active zone of the semiconductor device rapidly. Conversely, when the electric field is high, the permittivity is lower, which decreases the electric field in the layers adjacent to the insulator layer. The risk that these adjacent layers are damaged is thus reduced.

According to an embodiment, the dielectric material has a minimum permittivity and a maximum permittivity, the ratio between the minimum permittivity and the maximum permittivity being less than 70%.

According to an embodiment, the dielectric material has a maximum relative permittivity at least equal to 1000.

According to an embodiment, the insulator layer has a thickness less than 300 nm.

According to an embodiment, the non-linear dielectric material is in ferroelectric phase, in relaxor ferroelectric phase or in paraelectric phase.

According to an embodiment, the non-linear dielectric material is a solid solution in ferroelectric phase of PZT, PT, BT, KNN or BNT-BT type.

According to an embodiment, the non-linear dielectric material is a solid solution in relaxor ferroelectric phase of PMN, PMN-PT, PLZT, PST, PSN, BNT or BZT type.

According to an embodiment, the non-linear dielectric material is a solid solution in paraelectric phase of BST or BCTZ type.

According to an embodiment, the semiconductor device is a diode or a transistor.

According to an embodiment, the semiconductor structure is a heterostructure including a second semiconductor layer arranged on the first semiconductor layer.

BRIEF DESCRIPTION OF THE FIGURES

The invention and its different applications will be better understood on reading the description that follows and by examining the figures that accompany it, among which.

The figures are only presented for indicative purposes and in no way limit the invention.

For greater clarity, identical or similar elements are marked by identical reference signs in all of the figures.

DETAILED DESCRIPTION

An embodiment of a semiconductor device 200 according to the invention will now be described with reference to FIG. 2. The semiconductor device 200 is in the form of a lateral power diode.

The semiconductor device 200 comprises a semiconductor structure arranged on a substrate (not represented). The substrate may be made of silicon (Si), silicon carbide (SiC), gallium nitride (GaN), sapphire or any other appropriate material.

In this embodiment, the semiconductor structure is a heterostructure formed by a stack of semiconductor layers having different forbidden energy bands. The semiconductor structure of the semiconductor device 200 comprises for example a first semiconductor layer 201 arranged on the substrate and a second semiconductor layer 202 arranged on the first semiconductor layer 201.

According to another embodiment, the semiconductor structure may be a simple structure, that is to say a structure formed by a layer of a same semiconductor material but which includes zones doped according to opposite types of conductivity. In this case, the material used to produce the semiconductor structure may be silicon (Si), germanium (Ge), silicon carbide (SiC) or zinc oxide (ZnO).

Figure 2:
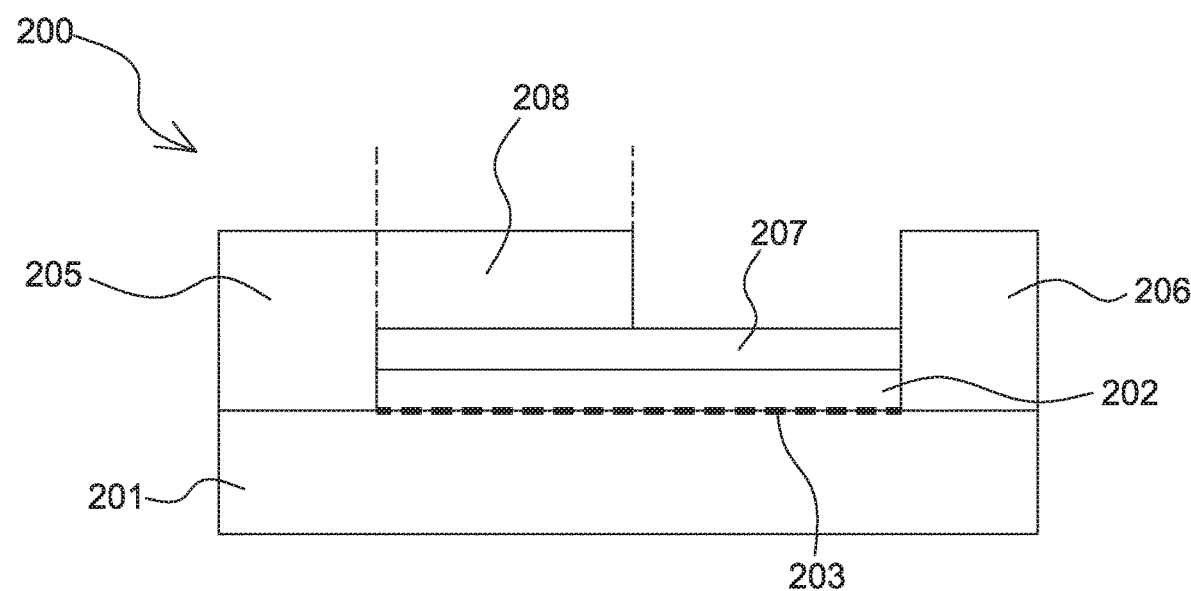
FIG. 2 is a transversal sectional view of a field plate semiconductor device according to an embodiment of the invention.

In the embodiment of FIG. 2, the first semiconductor layer 201 and the second semiconductor layer 202 are composed of semiconductor materials of different physical natures. In this case, the first semiconductor layer 201 is made of gallium nitride (GaN) and the second semiconductor layer 202 is made of aluminium gallium nitride (AlGaN).

In other embodiments, the first semiconductor layer 201 and the second semiconductor layer 202 may respectively be made of GaAs and $Al_xGa_{1-x}As$ (x<0.25), or $Ga_yIn_{1-y}As$ (y~0.8) and $Al_xGa_{1-x}As$ (x<0.25), and more generally HEMT (High-Electron-Mobility Transistor) structures based on III-V materials.

The semiconductor structure forms an active zone 203, that is to say a zone that contributes to the operation of the semiconductor device 200. In the case of the diode 200 of FIG. 2, the active zone 203 is a channel zone formed by a gas of electrons present at the interface between the first semiconductor layer 201 and the second semiconductor layer 202.

The semiconductor device 200 also comprises a first electrode 205 and a second electrode 206 arranged on the semiconductor structure. The first electrode 205 and the second electrode 206 form respectively the anode and the cathode of the diode 200. The first electrode 205 and the second electrode 206 are for example arranged directly on the first semiconductor layer 201, the second semiconductor layer 202 extending between the first electrode 205 and the second electrode 206. The electrodes 205, 206 are, in an embodiment, made of a metal material, such as copper doped aluminium (Al:Cu). The electrodes 205, 206 may be made of the same material or of different materials, for example copper doped aluminium Al:Cu for the second electrode 206 and titanium nitride TiN for the first electrode 205. The electrodes 205, 206 may in addition be constituted of several stacked metal materials, for example titanium Ti then copper doped aluminium Al:Cu for the second electrode 206; and titanium nitride TiN then tungsten W for the first electrode 205. Other possible materials for the electrodes 205, 206 are nickel (Ni) or nickel-Au (Ni/Au) type multilayers.

The semiconductor device 200 also comprises an insulator layer 207 arranged on the semiconductor structure and a field plate 208 arranged on the insulator layer 207. The field plate 208 is formed by an electrode that partially covers the insulator layer 207. The field plate makes it possible to avoid electric field peaks due to sudden discontinuities between the different materials. They are discontinuities either at the level of the potential profile, or at the level of the concentrations of electric charges.

In this embodiment, the field plate 208 forms part of the first electrode 205 and is an extension thereof. Alternatively, the field plate may be electrically connected to another electrode or instead be electrically isolated from the other electrodes.

The insulator layer 207 is for example arranged on the second semiconductor layer 202. The insulator layer 207 is made of a non-linear dielectric material, that is to say a dielectric material of which the permittivity depends on the electric field. In the context of the invention, the permittivity of the dielectric material is high under a low electric field, that is to say close to 0 V/m, and it is low under a high electric field, for example greater than 50 kV/M. In other words, the permittivity of the dielectric material decreases when the electric field increases.

Figure 3:
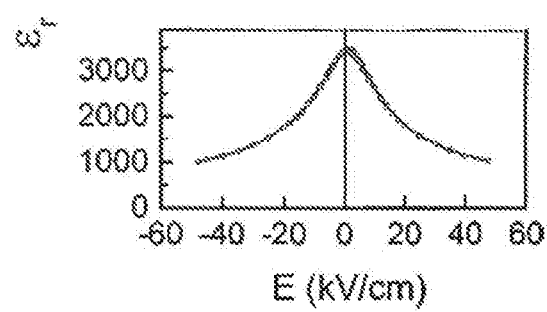
FIG. 3 is an example of a curve of the variation in the relative permittivity of a non-linear dielectric material as a function of electric field.

FIG. 3 is an example of curve representing the variation in the relative permittivity $\varepsilon_r$ of the non-linear dielectric material as a function of the electric field. In this example, the non-linear dielectric material is strontium bismuth titanate ($(SrBi)TiO_3$). It may be seen that the relative permittivity $\varepsilon_r$ is maximum for an electric field E close to 0 V/cm and decreases as the absolute value of the electric field E that traverses the dielectric material increases.

Thus, thanks to the present invention, it is possible to both improve the depletion of the electric charges of the active zone at low field and to improve the reliability of the semiconductor device 200 at high field.

In the context of the invention, the terms "low" and "high" and synonyms thereof, when they refer to the permittivity of the dielectric material, must be interpreted within the specific reference frame of the dielectric material. In other words, the permittivity at high field is low compared to the permittivity at low field, which for its part is thus high. The non-linear dielectric material has a ratio between its minimum permittivity and its maximum permittivity that is less than 70%, for example less than 50% and even less than 30% in an embodiment. The maximum relative permittivity of the non-linear dielectric material is, in an embodiment, greater than or equal to 1000.

The insulator layer 207 has a thickness less than 300 nm, and for example comprised between 10 nm and 200 nm. Thus, the thickness of the insulator layer 207 is the thinnest possible, which enables quicker depletion of the underlying gas of electrons, while remaining integrated, without parasitic leakage path. As a function of the permittivity values of the dielectric material at low field and at high field, it is possible to adjust the capacitance of the insulator layer 207 by adapting its thickness in such a way as to obtain the desired conditions for depletion of the active zone and appropriate protection against breakdown.

In an embodiment, the non-linear dielectric material is a material that crystallises in the perovskite structure $ABO_3$. More precisely, the non-linear dielectric material is in ferroelectric phase, in relaxor ferroelectric phase or in paraelectric phase. The ferroelectric phase has the particularity of having a hysteresis cycle. Most ferroelectric materials have a paraelectric phase at sufficiently high temperature; the paraelectric-ferroelectric transition temperature is called the Curie temperature $T_C$. A same material can thus be in paraelectric phase or ferroelectric phase depending on the temperature. For example, PZT has a Curie temperature $T_C$ of the order of 350-450° C. (depending on the Zr/Ti composition): it is in paraelectric phase above 350-450° C., or in ferromagnetic phase otherwise. Certain materials have a phase transition at low temperature, close to ambient temperature, which makes it possible to use them in their paraelectric phase: this is for example the case of BST or BCTZ. Relaxor ferromagnetics are characterised for their part by a large permittivity peak as a function of temperature, dependent on the frequency of the measurement field.

The non-linear dielectric material is for example a solid solution belonging to the following list:
  in ferroelectric phase, that is to say having a hysteresis cycle and a relatively high Curie temperature $T_C$:
    compounds of PZT type of formula Pb(Zr, Ti)O$_3$;
    compounds of PT type of formula PbTiO$_3$;
    compounds of BT type of formula BaTiO$_3$;
    compounds of KNN type of formula (K, Na)NbO$_3$;
    compounds of BNT-BT type of formula (Bi$_{1/2}$Na$_{1/2}$)TiO$_3$—BaTiO$_3$;
  in relaxor ferroelectric phase:
    compounds of PMN type of formula Pb[Mg$_{1/3}$Nb$_{2/3}$]O$_3$ or of PMN-PT type of formula Pb[Mg$_{1/3}$Nb$_{2/3}$]O$_3$—PbTiO$_3$ of which the relative permittivity varies between around 2000 at low field and around 300 at high field;
    compounds of PLZT type of formula (Pb, La)(ZrTi)O$_3$ of which the relative permittivity is around 4000 at low field, the relative permittivity decreasing at high field down to a value that depends on the concentration of the different elements;
    compounds of PST type of formula Pb(Sc$_{1/2}$Ta$_{1/2}$)O$_3$ of which the relative permittivity is between around 5000 at low field and around 1800 at 20 kV/cm;
    compounds of PSN type of formula Pb(Sc$_{1/2}$Nb$_{1/2}$)O$_3$;
    compounds of BNT type of formula (Bi$_{1/2}$Na$_{1/2}$)TiO$_3$;
    compounds of BZT type of formula Ba(Ti, Zr)O$_3$;
  in paraelectric phase, having a relatively low Curie temperature $T_C$, that is to say close to ambient temperature:
    compounds of BST type of formula (Ba, Sr)TiO$_3$;
    compounds of BCTZ type of formula Ba(Ti$_{0.8}$Zr$_{0.2}$)O$_3$—(Ba$_{0.7}$Ca$_{0.3}$)TiO$_3$.

This list is obviously not exhaustive.

Figure 1:
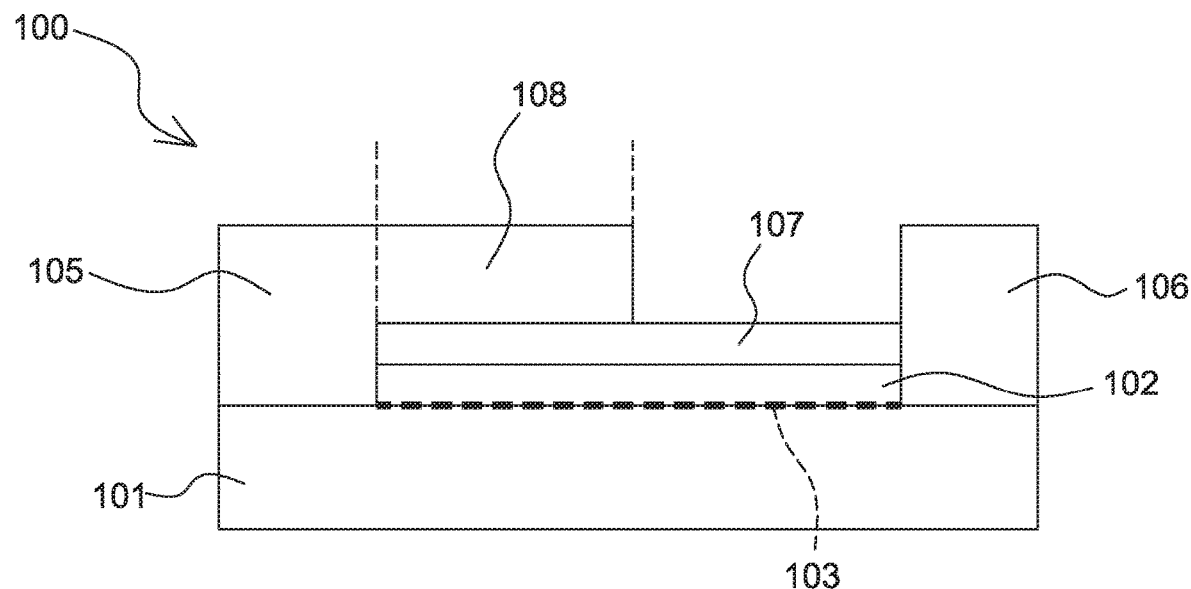
FIG. 1 is a transversal sectional view of a field plate semiconductor device according to the prior art.

The table below establishes a comparison between the semiconductor device 200 of FIG. 2 in which the insulator layer 207 is made of PMN and the semiconductor device 100 of FIG. 1 in which the insulator layer 107 is made of silicon nitride (SiN) which has a constant relative permittivity $\epsilon_r$. Different thicknesses $e_{AlGaN}$ of the second semiconductor layer 102, 202 and different thicknesses $e_{diel}$ of the insulator layer 107, 207 are considered.

| Dielectric material | $\epsilon_r$ | $e_{AlGaN}$ (nm) | $e_{diel}$ (nm) | $V_P$ (V) | $E_{max\_diel}$ (MV/cm) |
|---|---|---|---|---|---|
| SiN | 7.9 | 24 | 10 | 5.88 | 1.6 |
|  |  |  | 3 | 4.76 |  |
|  |  | 12 | 10 | 3.74 |  |
|  |  |  | 3 | 2.62 |  |
| PMN | 2000 | 24 | 200 | 4.4 | 0.006 |
|  |  |  | 150 | 4.34 |  |
|  |  |  | 100 | 4.31 |  |
|  |  | 12 | 200 | 2.27 |  |
|  |  |  | 150 | 2.2 |  |
|  |  |  | 100 | 2.17 |  |

It may be observed that the pinch-off voltage $V_P$ of the channel zone is lower in the case of the invention than in the prior art, which represents an improvement. Indeed, the lower the pinch-off voltage $V_P$, the lower the leakage current. The use of a non-linear dielectric material makes it possible to have a thicker insulator layer that is less subject to parasitic leaks and which is also easier to produce. The insulator layer may then be formed by successively depositing several sub-layers of lower thickness until reaching the desired total thickness. This makes it possible to further limit leakages because the leakages are due to defects in the dielectric material. Consequently, by having several sub-layers, the defects are not aligned from one sub-layer to the other and thus do not traverse the entire insulator layer.

Furthermore, for a same polarisation voltage, a decrease in the maximum electric field $E_{max\_diel}$ traversing the insulator layer is also observed. The reliability of the semiconductor device 200 at high field is thus improved.

It is to be noted that although it has been described with reference to a diode, the present invention may be applied to a transistor or to another semiconductor device.

In the case of a transistor, the three electrodes, namely the source, the gate and the drain, are in contact with the active zone 203. In particular, the insulator layer 207 cannot be located between the gate and the active zone 203.

Naturally, the invention is not limited to the embodiments described with reference to the figures and alternatives could be envisaged without going beyond the scope of the invention. The semiconductor device may notably have a vertical architecture instead of a lateral architecture.

The invention claimed is:

1. A semiconductor device comprising:
   a substrate;
   a semiconductor structure arranged on the substrate, the semiconductor structure including at least one first semiconductor layer and forming an active zone;
   an insulator layer arranged on the semiconductor structure;
   a field plate covering a part of the insulator layer;
   the insulator layer comprising a non-linear dielectric material having a permittivity that decreases as an electric field traversing the dielectric material increases, wherein the non-linear dielectric material is a solid solution in a relaxor ferroelectric phase of PMN, PMN-PT, PLZT, PST, PSN, BNT or BZT type, the semiconductor device being a diode or a transistor that includes a source electrode, a gate electrode and a drain electrode, wherein each of the source electrode, gate electrode and drain electrode is in contact with the active zone and wherein the insulator layer is not located between the gate electrode and the active zone.

2. The semiconductor device according to claim 1, wherein the dielectric material has a minimum permittivity and a maximum permittivity, the ratio between the minimum permittivity and the maximum permittivity being less than 70%.

3. The semiconductor device according to claim 1, wherein the dielectric material has a maximum relative permittivity at least equal to 1000.

4. The semiconductor device according to claim 1, wherein the insulator layer has a thickness less than 300 nm.

5. The semiconductor device according to claim 1, wherein the semiconductor structure is a heterostructure including a second semiconductor layer arranged on the first semiconductor layer.

* * * * *